US006326554B1

(12) United States Patent
Gillette et al.

(10) Patent No.: US 6,326,554 B1
(45) Date of Patent: Dec. 4, 2001

(54) SURFACE MOUNT FLEXIBLE INTERCONNECT AND COMPONENT CARRIER

(75) Inventors: Joseph G. Gillette; Scott F. Musil, both of Margate, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/533,702

(22) Filed: Mar. 23, 2000

(51) Int. Cl.[7] ..................................................... H05K 1/00
(52) U.S. Cl. ........................ 174/254; 174/260; 174/255; 361/749; 361/750; 361/751
(58) Field of Search ................................. 174/254, 255, 174/260; 361/749, 750, 751, 768, 808, 811, 812, 260

(56) References Cited

U.S. PATENT DOCUMENTS

| | | | |
|---|---|---|---|
| 5,386,341 | * 1/1995 | Olson et al. | 361/749 |
| 5,742,484 | 4/1998 | Gillette et al. | 361/789 |
| 5,748,450 | * 5/1998 | Kim et al. | 361/777 |
| 5,859,475 | * 1/1999 | Freyman et al. | 257/738 |
| 5,923,535 | * 7/1999 | Shimada et al. | 361/749 |
| 5,928,001 | 7/1999 | Gillette et al. | 439/67 |
| 5,981,870 | * 11/1999 | Barcley et al. | 174/35 |

* cited by examiner

Primary Examiner—Jeffrey Gaffin
Assistant Examiner—Jose H Accala
(74) Attorney, Agent, or Firm—Frank M. Scutch, III

(57) ABSTRACT

A surface mountable flexible interconnect and component carrier (10) for connecting to a main circuit board consists of a flex circuit (12) with solder pads (14) on one side for receiving an electronic component (15). There is an array of solderable pads (16) on the other side of the flex circuit, and each of the pads in the array has a solder bump (18) fused to it. The array of solderable solder pads (16) is electrically connected to the solder pads (14) for receiving the electronic component (15) by means of electrically conductive vias in the flexible film. A rigid carrier (20) is used to hold the flex circuit in position prior to placement on the circuit board. An opening (26) in the rigid carrier is strategically located so that the electronic component can be soldered to the solder pads. One portion of the rigid carrier is attached with a permanent adhesive (22) to the flex directly above the array of solder pads, and another portion of the rigid carrier is adhesively bonded to the flex circuit at a second, remote, location with a temporary adhesive (24). A breakaway tab (28) is situated between the two portions to aid in removing part of the rigid carrier after assembly.

12 Claims, 1 Drawing Sheet

SURFACE MOUNT FLEXIBLE INTERCONNECT AND COMPONENT CARRIER

TECHNICAL FIELD

This invention relates to connectors for printed circuit boards, and more specifically, to a surface mountable flexible connector for printed circuit boards.

BACKGROUND

Miniaturization and decreasing feature size is a fact of life in the electronics industry. The relentless demand for reduced size continues to drive every facet of the packaging business. However, advances in board-to-board interconnections and board-to-flex interconnections have not kept pace with the advances in the semiconductor industry, and are lagging behind the race for higher and higher interconnect densities. Interconnect system manufacturers have been forced to decrease the pitch and size of leads, thus compromising manufacturability and reliability. Consequently, input/output (I/O) counts for zero-insertion force (ZIF) and low-insertion force (LIF) connectors have come to a standstill. These types of connectors provide electrical contact by bringing together two components under very low force, then pressing them together in a z-axis direction. Chip-scale technology demands interconnects of 200–400 I/O today, and 1500 I/O per $in^2$ will soon be needed. Conventional ZIF and LIF connector size is limited by tolerances of the molding process. For example, the molded body of very large high I/O count ZIF connector tends to warp, leading to non-coplanar leads. One solution to this problem is to decrease pitch and size, but this compromises manufacturability and reliability. While this solves a stress problem in the assembly, it still has a rigid connector on a PCB and requires additional parts. Further, flexible circuits don't lend themselves well to automated assembly. The advantages accrued by the flexibility of the film also work to one's disadvantage, because the flexibility of the film makes it hard to handle with robotics. The ongoing activity in the field of PCB interconnection is a testament to the importance and need for a robust, mechanically compliant, automatable interconnect system. Clearly, today's conventional approach of linear connectors that utilize a single side of the printed circuit board (PCB) or flexible circuit will not meet the need.

DETAILED DESCRIPTION OF THE PREFERRED EMBODIMENT

Figure 1:
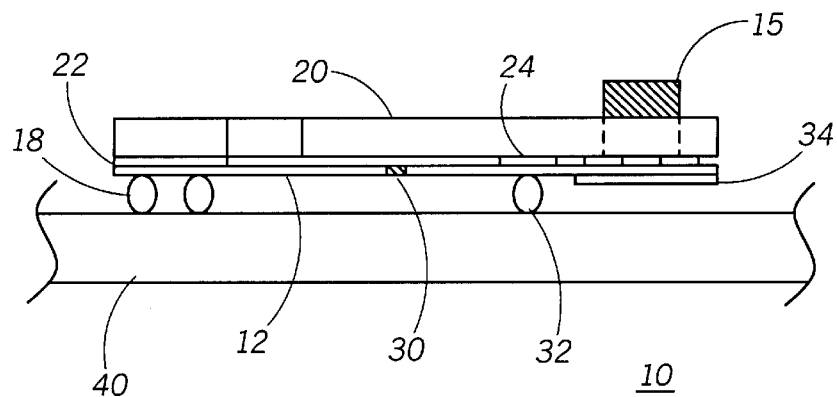
FIG. 1 is a side view of a surface mountable flexible interconnect and component carrier in accordance with the invention.

A surface mountable flexible interconnect and component carrier for connecting to a circuit board consists of a flex circuit with solder pads on one side for receiving an electronic component. There is an array of solderable pads on the other side of the flex circuit, and each of the pads in the array has a solder bump fused to it. The array of solderable solder pads is electrically connected to the electronic component solder pads by means of electrically conductive vias in the flexible film. A rigid carrier is used to hold the flex circuit in position prior to placement on the circuit board. One portion of the rigid carrier is attached to the flex with a permanent adhesive, directly above the array of solder pads, and another portion of the rigid carrier is adhesively bonded to the flex circuit at a second, remote, location with a temporary adhesive. An opening in the rigid carrier is strategically located so that the electronic component can be soldered to the solder pads. A breakaway tab is situated between the two portions to aid in removing part of the rigid carrier after assembly.

While the specification concludes with claims defining the features of the invention that are regarded as novel, it is believed that the invention will be better understood from a consideration of the following description in conjunction with the drawing figures.

Figure 2:
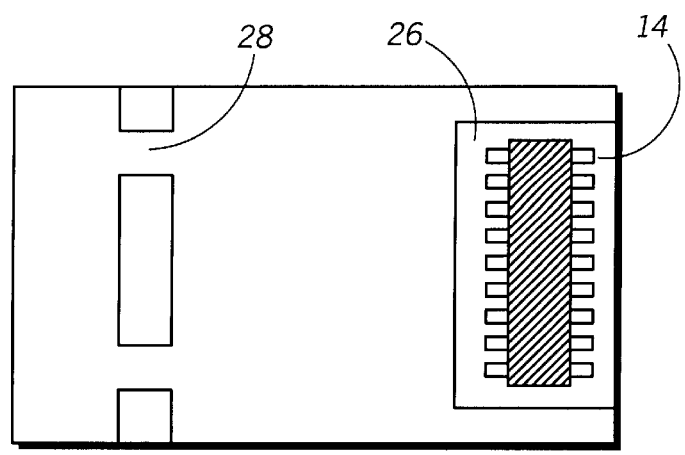
FIG. 2 is a top plan view of the surface mountable flexible interconnect and component carrier shown in FIG. 1.
Figure 3:
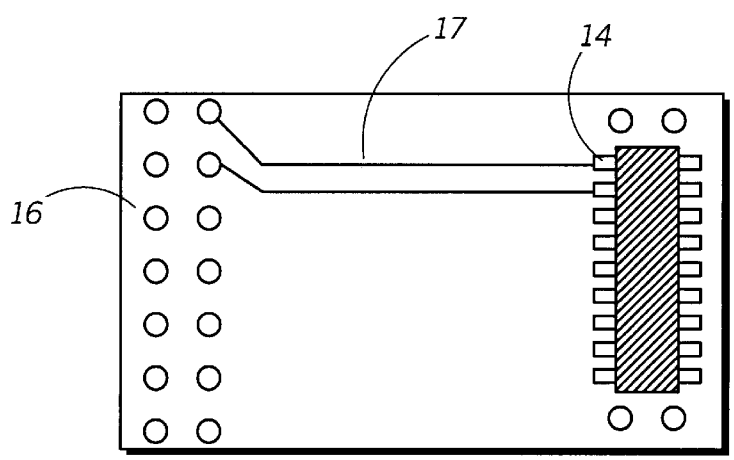
FIG. 3 is a bottom plan view of a flex circuit used in the surface mountable flexible interconnect and component carrier shown in FIGS. 1 and 2.

Referring now to FIGS. 1, 2, and 3, side, top plan, and bottom plan views of a preferred embodiment of the invention, the surface mountable flexible interconnect that component carrier 10 consists of a flexible film 12 that serves as the heart of the interconnect system. The flexible film is typically a polyester or polyimide film, from 0.1 to 0.3 mm in thickness, comparable to what is commonly used in the electronics industry for flexible circuitry. On one side of the flexible film 12 is a plurality of solderable pads 16 preferably arranged in an array similar to that found on the popular ball grid array integrated circuit packages. In the preferred embodiment, the solderable pads 16 are copper (optionally plated with materials such as tin/lead alloys, nickel or gold), but other conductive materials such as aluminum, titanium, or graphite-based inks will also find favor. Titanium or aluminum are typically sputtered onto the flexible film, whereas the graphite-based inks are typically screen printed. Typically, each solderable pad 16 has an electrically conductive media, such as a solder ball 18 or an electrically conductive adhesive, adhered to it. The solder ball 18 is typically a sphere of eutectic tin-lead solder that is fused to the solderable pad 16, although other fusible compositions that do not contain lead may also be used. On an opposite ace of the flexible film 12 is a plurality of solderable pads 14 arranged so as to correspond to the terminations of an electronic component 15. In practice, most of all of the solderable pads 14 are electrically connected to the array of solderable pads 16 by electrically conductive runners 17 and/or vias 30 in the flexible film 12. Typically, the electronic component 15 is soldered to the solderable pads 14. Attachment of the electronic component to the flexible film can occur at a number of stages in the assembly, either prior to or subsequent to attachment of the surface mountable flexible interconnect and component carrier to the main PCB. The electronic component can be one or more integrated circuit packages or one or more discrete passive components such as resistors, capacitor, and inductors.

A rigid retainer member 20 is used to hold the flexible film 12 securely in a predetermined position. In the preferred embodiment, the rigid member is a laminated sheet, similar to that commonly used as printed circuit board material. Indeed, we have found that common epoxy-glass or polyimide glass circuit board laminate without the copper cladding functions quite well as a carrier. Other materials such as injection molded plastic or stamped metal can also be used with efficacy. One portion of the flexible film is adhesively bonded to a corresponding portion of the rigid member by applying a permanent adhesive 22 to selected locations of the rigid member and the film. Depending on the application, one may employ a thermoplastic adhesive or a thermoset adhesive. Typically, the adhesive lies directly over the solderable pads and the solder bumps. This approach captures one end of the flexible film so that the solder bumps are always maintained in a coplanar relationship, and so that the solder connection to a main PCB can be made in the well tested and reliable controlled-collapse-chip-carrier-connection (C5). Another portion of the rigid member is adhesively bonded to the flex circuit at a second, remote, location by means of a temporary adhesive 24. The temporary adhesive 24 and the permanent adhesive 22 are formulated so that the adhesive strength of the temporary adhesive is substantially less than the adhesive strength of the permanent adhesive. The adhesive strength of the temporary adhesive should be such that one portion of the rigid member remains bonded to the flexible film during normal handling, but can be easily removed once the assembly is soldered onto the main PCB. The adhesive strength of the permanent adhesive should be such that the other portion of the rigid member remains bonded to the flexible film at all times, even when the first portion of the rigid member is torn away. A breakaway portion 28 is formed in the rigid member 20. In the case of a laminated PCB material, a series of closely spaced holes or slots are machined in the laminate, or if the carrier is molded plastic, a thin section can be made. These features create stress risers in the rigid member, allowing it to be easily and controllably broken.

An aperture 26 is strategically located in the rigid member 20 in order to allow attachment on an electronic component 15 to the flexible film. The aperture 26 is arranged so that adequate clearance is maintained around the component 15 and any associated leads, and so that the array of solderable pads 14 on the flexible film are exposed.

To use the interconnect, it is positioned so that the solder bumps 18 and the array of solderable pads 16 are aligned to correspond to a mating array of solderable pads on the main PCB 40. The interconnect is positioned on the PCB 40, and soldered in place by passing through a reflow oven. Note that no special fixturing is needed to hold the interconnect in place, as is typically needed when soldering an unsupported film. After soldering, one portion of the rigid member is removed from the film, as it is no longer needed to hold the film steady. This is accomplished by heating the adhesive above its melt or softening point so that the adhesive releases its bond, and lifting that portion of the rigid member vertically so that it breaks at the breakaway tab. Alternatively, if a low tack pressure sensitive adhesive (PSA) is used as the temporary adhesive, it can simply be removed manually at room temperature. When the rigid member is broken on the score line, one part of it is discarded and the other part (bonded to the flexible film by the permanent adhesive) it remains attached to the flex circuit. Once the broken portion of the rigid member has been removed, the underlying flexible film 12 with the electronic component 15 attached is now free to move, and it can be folder or otherwise manipulated to provide additional degrees of freedom in packaging the connector into a housing.

Optionally, inactive solder spheres or bumps 32 can be added on the portion of the flexible film that is remote from the array of solderable pads 16. These inactive bumps do not get soldered to the main PCB 40, but merely serve to aid in positioning the carrier, i.e., maintain it in a level position so that the solder balls remain co-planar to the surface of the main PCB 40. In another embodiment, a stiffener 34 is attached to the lower surface of the flexible film under the plurality of solder pads for the electronic component so as to locally planarize the flexible film.

In summary, a novel surface mountable flexible interconnect and component carrier has been created that satisfies a long felt need in the industry for a low cost, low profile, reliable, flexible surface mount interconnect. The rigid member provides a flat, reproducible surface for use with the vacuum chucks commonly found on automated pick and place machines. Thus, our novel interconnect can also be placed by robots and other types of automated machines in a highly reliable fashion, and significantly reduces the overall cost of the assembly. The use of the rigid member now makes the flexible film behave much like any other surface mounted component, allowing its use in tape and reel format, bowl feeding, stick and tubes, or tray feeding. While the preferred embodiments of the invention have been illustrated and described, it will be clear that the invention is not so limited, as alternate embodiments have been described herein. Other equivalents, such as placing the electronic component on an opposite side of the flexible film and adding additional breakaway portions in the rigid member, will occur to those skilled in the art without departing from the spirit and scope of the present invention as defined by the appended claims.

What is claimed is:

1. A surface mountable flexible interconnect and component carrier, comprising:
    a flexible film comprising:
        a plurality of first solder pads arranged on an upper surface of the film for receiving corresponding terminal portions of an electronic component;
        an array of second solder pads arranged on an opposing lower surface of the film;
        an electrically conductive bump attached to each of the second solder pads; and
        the first solder pads electrically connected to the second solder pads by means of electrically conductive vias in the flexible film;
    a rigid member attached to the flexible film, comprising:
        first and second portions, the first portion fixedly attached to the flexible film upper surface at a first location, and the second portion temporarily attached to the flexible film upper surface at a second location;
        an aperture located directly above said plurality of first solder pads to reveal said plurality of first solder pads; and
        a breakaway portion situated between the first and second portions and arranged such that said second portion of the rigid member can be removed by breaking said breakaway portion and detaching said second portion from said temporarily attached second location.

2. The surface mountable flexible interconnect and component carrier as described in claim 1, wherein the electrically conductive bump is a solder bump.

3. The surface mountable flexible interconnect and component carrier as described in claim 1, wherein the flexible film is polyester or polyimide.

4. The surface mountable flexible interconnect and component carrier as described in claim 1, wherein the rigid member is a laminated sheet, injection molded plastic, or metal.

5. The surface mountable flexible interconnect and component carrier as described in claim 1, further comprising copper or graphite-based conductive ink electrically conductive runners.

6. The surface mountable flexible interconnect and component carrier as described in claim 1, wherein the film is fixedly attached to the rigid member by a thermoplastic, thermoset, or pressure sensitive adhesive.

7. The surface mountable flexible interconnect and component carrier as described in claim 1, wherein the film is temporarily attached to the rigid member by a thermoplastic, thermoset, or pressure sensitive adhesive.

8. The surface mountable flexible interconnect and component carrier as described in claim 1, wherein the breakaway portion comprises a pre-scored break point that will allow the interconnect to bend when the break point is broken.

9. The surface mountable flexible interconnect and component carrier as described in claim 1, further comprising a stiffener attached to the lower surface of the flexible film under the plurality of first solder pads.

10. The surface mountable flexible interconnect and component carrier as described in claim 1, further comprising one or more inactive solder spheres situated on the lower surface, remote from the array of second solder pads.

11. The surface mountable flexible interconnect and component carrier as described in claim 1, further comprising a plurality of electrically conductive runners on the upper surface of the flexible film.

12. The surface mountable flexible interconnect and component carrier as described in claim 1, further comprising an electronic component attached to the plurality of first solder pads.

* * * * *